United States Patent
Fujioka et al.

(10) Patent No.: US 7,242,631 B2
(45) Date of Patent: Jul. 10, 2007

(54) SEMICONDUCTOR MEMORY DEVICE AND INFORMATION PROCESSING SYSTEM

(75) Inventors: Shinya Fujioka, Kawasaki (JP); Yasuyuki Eguchi, Kawasaki (JP); Atsushi Sukeno, Kawasaki (JP); Koutoku Sato, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/236,739

(22) Filed: Sep. 28, 2005

(65) Prior Publication Data
US 2006/0274591 A1 Dec. 7, 2006

(30) Foreign Application Priority Data
Jun. 7, 2005 (JP) ............... 2005-166782

(51) Int. Cl.
*G11C 7/00* (2006.01)
(52) U.S. Cl. ................. 365/222; 365/149
(58) Field of Classification Search ........... 365/222, 365/154, 149, 49
See application file for complete search history.

(56) References Cited

U.S. PATENT DOCUMENTS

| | | | |
|---|---|---|---|
| 5,031,147 A * | 7/1991 | Maruyama et al. .... 365/189.07 |
| 5,566,119 A | 10/1996 | Matano | |
| 6,064,625 A | 5/2000 | Tomita | |
| 6,195,303 B1 | 2/2001 | Zheng | |
| 6,246,620 B1 | 6/2001 | Fujioka et al. | |
| 6,459,641 B2 | 10/2002 | Fujioka et al. | |
| 6,577,550 B2 * | 6/2003 | Ito .............. 365/222 |
| 6,801,468 B1 * | 10/2004 | Lee .............. 365/222 |
| 2004/0240299 A1 | 12/2004 | Fujimoto et al. | |
| 2005/0105357 A1 * | 5/2005 | Oh .............. 365/222 |

FOREIGN PATENT DOCUMENTS

JP 98/56004 12/1998
JP 11016346 A 1/1999

* cited by examiner

*Primary Examiner*—Anh Phung
(74) *Attorney, Agent, or Firm*—Arent Fox LLP

(57) ABSTRACT

A refresh operation at a memory cell array for keeping data stored in memory cells is enabled to be switched whether to be executed based on an external refresh request inputted from external or an internal refresh request generated internally by a refresh control unit, and therefore, when the refresh operation is executed based on the external refresh request, it becomes possible to execute an access operation for the memory cell array in accordance with an access request from external only with a necessary time for executing the operation in accordance with the access request without including a necessary time for executing the refresh operation.

22 Claims, 12 Drawing Sheets

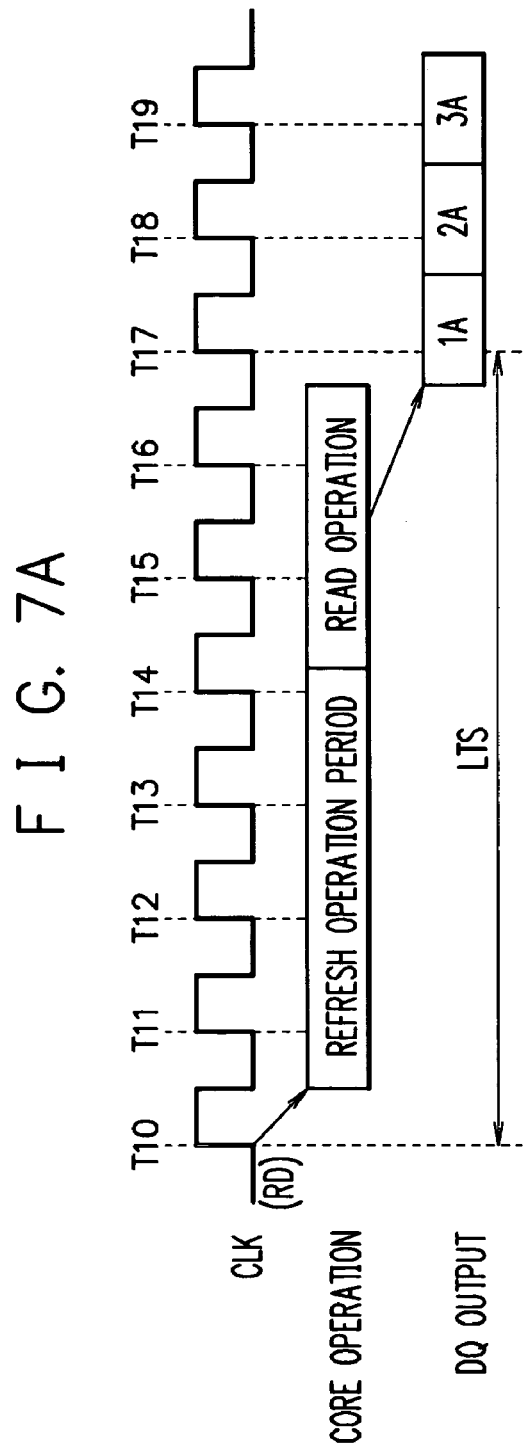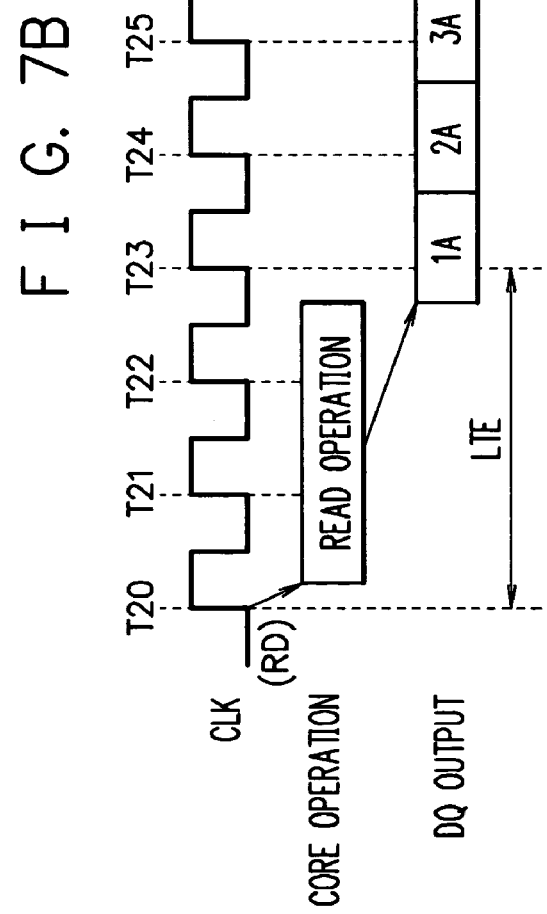

F I G. 8

|  | CLK | CE2 | /CE1 | /RF | /ADV | /OE | /WE | /UB | /LB |
|---|---|---|---|---|---|---|---|---|---|
| Read | ↑ | H | L | H | L | L | H | – | – |
| Write | ↑ | H | L | H | L | H | L | – | – |
| ExREF | ↑ | H | L | L | H | H | L | H | H |
| SREFEN | ↑ | H | L | L | H | L | H | H | H |
| PD Entry | x | L | x | x | x | x | x | x | x |
| PD Exit | x | H | H | x | x | x | x | x | x |

X : Don't Care

SEMICONDUCTOR MEMORY DEVICE AND INFORMATION PROCESSING SYSTEM

CROSS-REFERENCE TO RELATED APPLICATIONS

This application is based upon and claims the benefit of priority from the prior Japanese Patent Application No. 2005-166782, filed on Jun. 7, 2005, the entire contents of which are incorporated herein by reference.

BACKGROUND OF THE INVENTION

1. Field of the Invention

The present invention relates to a semiconductor memory device and an information processing system, and is particularly suitable for use in a pseudo SRAM (Static Random Access Memory).

2. Description of the Related Art

A pseudo SRAM being one of a semiconductor memory device is a memory in which memory cells for storing data are composed of similar cells with a DRAM (Dynamic Random Access Memory), and an external interface thereof is compatible with an SRAM. The pseudo SRAM has a characteristic of the DRAM which has a large capacity with a low bit cost compared to the SRAM, and an equivalent usability with the SRAM, and the large capacity and an easiness for system designing are realized. For example, a low power (low power consumption) pseudo SRAM is used as a memory (RAM) of, for example, a cellular phone or PDA (Personal Digital Assistants).

FIG. 11 is a block diagram showing a configuration of a conventional pseudo SRAM 111. The pseudo SRAM 111 has a memory cell array 112, an array control circuit 113, a refresh control circuit 114, a chip control circuit 115, an address decoder 116, a data signal control circuit 117, and an interface circuit 118.

The memory cell array 112 is composed of a plurality of memory cells disposed in array state in a row direction and a column direction. As stated above, respective memory cells are 1T-1C type (one transistor one capacitor type) memory cells which are similar to the DRAM. The array control circuit 113 executes a data read operation, a data write operation, and a refresh operation for the memory cells within the memory cell array 112.

The refresh control circuit 114 outputs a request of the refresh operation required for keeping data stored in the memory cells in accordance with a value of a timer included inside thereof.

The chip control circuit 115 decodes a command signal CMD from external (external command) supplied via the interface circuit 118, and outputs the decoded result and a control signal based on the refresh request from the refresh control circuit 114, to the array control circuit 113. As stated later, the command signal CMD is composed of a chip enable signal /CE, an address valid signal /ADV, an output enable signal /OE, and a write enable signal /WE (a sign "/" added to each symbol of signal shows that the signal is a negative logic).

Besides, the chip control circuit 115 performs an arbitration (arbitration process) between an access request (data read and write) by the command signal CMD and the refresh request. In this arbitration, the request generated former is processed in preference.

The address decoder 116 decodes an address signal ADD from external supplied via the interface circuit 118, and outputs the decoded result to the array control circuit 113.

The data signal control circuit 117 controls sending and receiving of data signals between internal and external of a memory in the read operation and the write operation executed in accordance with the command signal CMD.

Incidentally, a clock signal CLK for synchronizing an input/output timing of the command signal CMD and a data signal DQ is inputted to the interface circuit 118 from external, and it is supplied to each functional unit within the pseudo SRAM 111.

Operations in the conventional pseudo SRAM are described with reference to FIG. 12A and FIG. 12B. In FIG. 12A and FIG. 12B, a core operation is a selection operation of the memory cell array 112, in other words, it is an operation that the array control circuit 113 executes for the memory cell array 112. Besides, a Peri operation is an operation of peripheral circuits such as the chip control circuit 115 and the data signal control circuit 117 concerning the memory cell array 112 (array control circuit 113).

FIG. 12A is a timing chart explaining a data read operation in the conventional pseudo SRAM. First, at the time T31, the chip enable signal /CE making a device (pseudo SRAM) in operation state, the address valid signal /ADV showing that the address signal ADD is valid, and the output enable signal /OE are turned to "L". The chip control circuit 115 decodes the command signal CMD and judges that an access request from external is a data read operation RD (A). Further, the address decoder 116 takes and decodes the address signal ADD.

However, if the refresh request from the refresh control circuit 114 is generated before the time T31 when the access request from external is received, a refresh operation REF is executed at the memory cell array 112 (time T32). Next, the data read operation RD (A) is executed at the memory cell array 112 from the time T33 when the refresh operation REF is terminated, and data 1A, 2A, and 3A of the memory cells corresponding to the decoded results at the address decoder 116 are sequentially read to be outputted as the data signals DQ.

At the time T34, when the chip enable signal /CE is turned to "H", the chip control circuit 115 indicates the termination of the data read operation RD (A) to the array control circuit 113. Herewith, the data read operation RD (A) executed at the memory cell array 112 is terminated (time T35).

Besides, at the time T35, when the chip enable signal /CE and the address valid signal /ADV is turned to "L", the chip control circuit 115 decodes the command signal CMD at this time, and judges that the access request from external is a data read operation RD (B). Besides, the address decoder 116 takes and decodes the address signal ADD.

Next, at the time T36 when a refresh entry term TREN is lapsed from the time T35, the data read operation RD (B) is executed at the memory cell array 112, and the data 1B, 2B, 3B, 4B, and 5B are outputted as the data signals DQ. Incidentally, the refresh entry term TREN is provided constantly between the data read/write operations by the access request from external so that the refresh operation at the memory cell array 112 can be executed when the refresh request is generated.

Subsequently, as same as the data read operation RD (A), the chip enable signal /CE is turned to "H" at the time T37, and thereby, the data read operation RD (B) executed at the memory cell array 112 is terminated (time T38).

FIG. 12B is a timing chart explaining a data write operation in the conventional pseudo SRAM. The data write operation shown in FIG. 12B is the same as the data read operation shown in FIG. 12A other than points that the write enable signal /WE is turned to "L" and the output enable signal /OE is kept to "H", and the data 1A to 3A and 1B to 5B supplied as the data signals DQ are written to the memory cells (times T41 to T48 in FIG. 12B are respectively corresponding to times T31 to T38 in FIG. 12A), and therefore, the explanation thereof will not be given.

In the conventional pseudo SRAM, the data read operation, the data write operation, and so on are executed as shown in FIG. 12A and FIG. 12B.

Further, in recent years, data communications with a large capacity and in real time are performed concerning moving image data and so on, and therefore, a higher-speed operation is required for the pseudo SRAM used as a memory of data communication devices including a cellular phone and so on.

[Patent Document 1] Japanese Patent Application Laid-open No. Hei 11-16346

[Patent Document 2] International Publication No. 98/56004 pamphlet

However, in the conventional pseudo SRAM, as shown in FIG. 12A and FIG. 12B, the refresh entry term TREN is constantly provided, and therefore, as a latency, an access time concerning the access request from external is defined so as to include a case when the refresh request is generated in advance which is the worst case.

As a method to realize a high-speed operation (access) in the pseudo SRAM, the method to shorten the latency to cut down the access time is conceivable. However, if the latency is shortened, a time interval between the data read/write operations by the access requests from external becomes shortened, and there is a possibility that the term corresponding to the refresh entry term TREN cannot be secured. Namely, if the latency is shortened, there is a possibility that the refresh operation cannot be executed between the operations concerning the access requests from external even though the refresh request is generated, and therefore, the data stored in the memory cell may be lost.

SUMMARY OF THE INVENTION

An object of the present invention is to realize a high-speed access operation of a pseudo SRAM.

A semiconductor memory device of the present invention includes: a memory cell array in which a plurality of memory cells storing data are disposed; a refresh control unit indicating an execution of a refresh operation for keeping the data stored in the memory cells in accordance with a refresh request; and an array control unit executing the refresh operation at the memory cell array based on the indication from the refresh control unit. A refresh request selector selecting the external refresh request during a period from an input of the external refresh request to an input of a self refresh permission request, and selecting an internal refresh request generated internally for oneself other than the period, is provided in the refresh control unit. The refresh control unit enables a switching of the refresh operation at the memory cell array whether to be executed based on the external refresh request or the internal refresh request.

According to the configuration stated above, when the refresh operation at the memory cell array is executed based on the external refresh request, it is not required to secure a necessary time for the execution of the refresh operation within an access time, when the operation in accordance with the access request from external for the memory cell array is executed.

BRIEF DESCRIPTION OF THE DRAWINGS

FIG. 7A and FIG. 7B are timing charts showing operation examples of the semiconductor memory device according to the present embodiment;

FIG. 8 is a view showing command examples of the semiconductor memory device according to the present embodiment;

DETAILED DESCRIPTION OF THE PREFERRED EMBODIMENTS

Hereinafter, an embodiment of the present invention is described with reference to the drawings.

Figure 1:
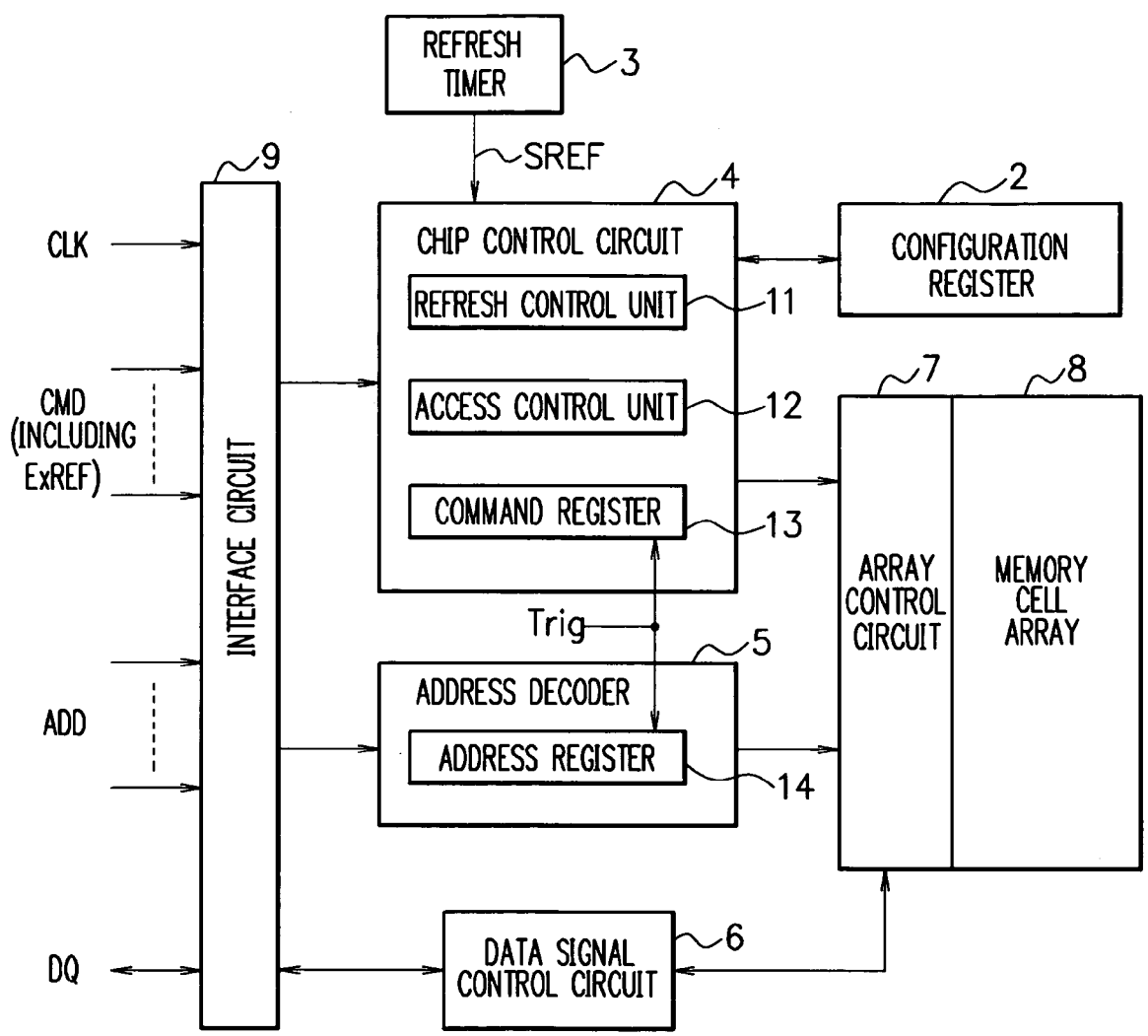
FIG. 1 is a block diagram showing a configuration example of a semiconductor memory device according to an embodiment of the present invention.

FIG. 1 is a block diagram showing a configuration example of a semiconductor memory device 1 according to an embodiment of the present invention. The semiconductor memory device 1 is a pseudo SRAM, and has a configuration register 2, a refresh timer 3, a chip control circuit 4, an address decoder 5, a data signal control circuit 6, an array control circuit 7, a memory cell array 8, and an interface circuit 9.

The configuration register 2 is a register to set an operation mode (operation state) of the semiconductor memory device 1. A switching between an asynchronous mode and a synchronous mode and an operation in a power down mode are controlled based on a setting of the configuration register 2.

Here, the asynchronous mode is an operation mode to operate in asynchronous with a clock signal (system clock signal) inputted into the semiconductor memory device 1 (chip), and the synchronous mode is an operation mode to operate in synchronous with the clock signal. The asynchronous mode and the synchronous mode have, for example, different triggers of command signal CMD. In the asynchronous mode, an operation period such as an access time (latency) is defined not by a clock number and so on, but by an absolute time, and the semiconductor memory device 1 operates based on a timing when a signal (command signal, and so on) is negated or asserted. Meanwhile, in the synchronous mode, the operation period such as the access time (latency) is defined by using the clock.

The refresh timer 3 measures a time by using a measuring means such as a counter, and outputs a self refresh (internal refresh) signal SREF to the chip control circuit 4 every time when a predetermined period is lapsed. The self refresh signal SREF is a signal to request a refresh operation for keeping data stored within the respective memory cells in the memory cell array 8. The refresh timer 3 corresponds to a refresh request unit in the present invention, and the self refresh signal SREF corresponds to an internal refresh request in the present invention.

The chip control circuit 4 has a refresh control unit 11, an access control unit 12, and a command register 13, and achieves an overall control of the operations of the respective circuits within the semiconductor memory device 1. Concretely speaking, the chip control circuit 4 has a not shown decoder, and decodes a command signal CMD from external (external command) which is supplied via the interface circuit 9. Further, the chip control circuit 4 outputs a control signal to the array control circuit 7 based on the decoded result of the command signal CMD and the self refresh signal SREF from the refresh timer 3. Besides, the chip control circuit 4 performs an arbitration (arbitration process) between an access request concerning the data read/write by the external command CMD and the refresh request by the self refresh signal SREF when an operation state of the semiconductor memory device 1 is in a self refresh mode executing a self refresh.

The refresh control unit 11 achieves a control concerning a refresh operation executed at the memory cell array 8 for keeping stored data. The refresh control unit 11 outputs a control signal concerning the refresh operation to the array control circuit 7 based on a command signal CMD from external (for more detail, external refresh signal (command) ExREF CMD) inputted via the interface circuit 9 and the self refresh signal SREF from the refresh timer 3. Here, the external refresh command ExREF CMD corresponds to the external refresh request in the present invention.

The access control unit 12 achieves a control concerning a data read operation and a data write operation for the memory cell array 8 based on the command signal CMD from external supplied via the interface circuit 9. The command register 13 is a register to hold a decoded result obtained by decoding the supplied command signal CMD from external.

The address decoder 5 decodes an address signal ADD from external supplied via the interface circuit 9, and outputs a selection address signal based on the decoded result to the array control circuit 7. Besides, the address decoder 5 has an address register 14 holding the decoded result obtained by decoding the address signal ADD. The decoded result held in the address register 14 and the decoded result held in the command register 13 relate to the same request, and the decoded results held in the command register 13 and the address register 14 are outputted in synchronization based on a trigger signal Trig.

The data signal control circuit 6 controls a sending/receiving of data signals DQ between internal and external of the semiconductor memory device 1 via the interface circuit 9 in the read operation and the write operation for the memory cell array 8 executed in accordance with the command signal CMD from external.

The array control circuit 7 executes the read operation, the write operation, and the refresh operation for memory cells in the memory cell array 8, based on the control signal supplied from the chip control circuit 4 and the selection address signal supplied from the address decoder 5.

The memory cell array 8 has a plurality of memory cells disposed in array state in a row direction and a column direction. Concretely speaking, the memory cell array 8 has plural bit lines and plural word lines provided to intersect with the bit lines, and the memory cells are disposed at intersection portions of the bit lines and the word lines. The respective memory cells are composed of 1T-1C type (one transistor and one capacitor type) memory cells which are the same as a DRAM, and they store data of one bit respectively. Besides, the memory cell array 8 has sense amplifiers provided with corresponding to the bit lines.

The interface circuit 9 is for sending and receiving each signal between internal and external of the semiconductor memory device 1. The command signal CMD and the address signal ADD are inputted from external to the interface circuit 9, and the data signal DQ is inputted/outputted between external. Besides, a clock signal CLK to synchronize an input/output timing of the command signal CMD and the data signal DQ is inputted from external, and supplied to the respective circuits within the semiconductor memory device 1.

Figure 2:
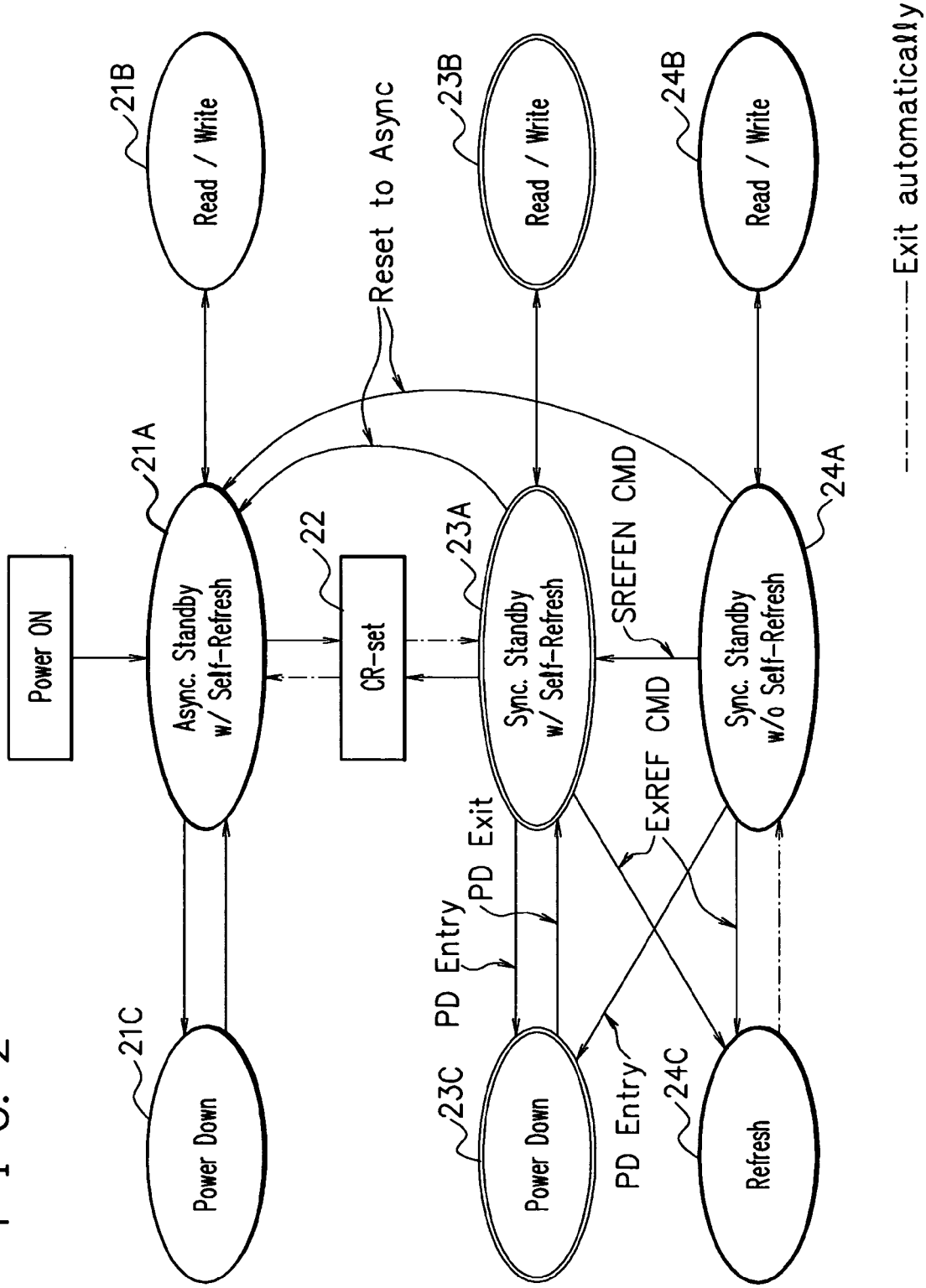
FIG. 2 is a view for explaining a state control of the semiconductor memory device according to the present embodiment.

An operation mode (operation state) of the semiconductor memory device 1 according to the present embodiment is described. FIG. 2 is a view for explaining a state control of the semiconductor memory device 1. Incidentally, in the explanation stated below, the command signals CMD from external requesting the read operation and the write operation for the semiconductor memory device 1 (memory cell array 8) are called as a read command and a write command. Further, the command signal CMD from external for operating the semiconductor memory device 1 in low power consumption (set the operation mode to a power-saving mode whose power consumption is lower than the normal operation mode) is called as a power down command, and the command signal CMD from external to return to the normal operation mode is called as a power down release command.

After a power supply is started (Power ON), namely at activation time, the semiconductor memory device 1 becomes a standby state of an asynchronous mode (Async. Standby w/Self-Refresh) 21A. In this asynchronous mode, so-called a self refresh operation is executed in which the refresh operation in the memory cell array 8 is executed based on the self refresh signal SREF from the refresh timer 3 inside of the semiconductor memory device 1.

When the semiconductor memory device 1 receives the read command or the write command in the state 21A, it executes the corresponding read operation or the write operation (Read/Write) 21B, and after the operation is terminated, it returns to the standby state 21A. When the semiconductor memory device 1 receives the power down command (PD Entry) in the standby state 21A, it is transferred to a power down mode (Power Down, power-saving mode) 21C in which the low power consumption operation is executed. When the power down release command (PD Exit) is received in the power down mode 21C, it is transferred to the standby state 21A of the asynchronous mode.

Besides, when a predetermined setting code is inputted together with a configuration register setting (CR-set) command 22 in the standby state 21A of the asynchronous mode, and thereby, the setting of the configuration register 2 is changed to a predetermined setting, the semiconductor memory device 1 is transferred to a standby state of synchronous mode with self refresh (hereinafter, called also as "self refresh mode") (Sync. Standby w/Self-Refresh) 23A. Here, the self refresh mode is the synchronous mode and it is the operation mode in which the refresh operation in the memory cell array 8 is executed based on the self refresh signal SREF from the refresh timer 3 inside of the semiconductor memory device 1. Incidentally, it is possible to transfer the operation mode of the semiconductor memory device 1 to the standby state 21A of the asynchronous mode by changing the setting of the configuration register 2 into the predetermined setting by using the configuration register setting command 22 in the standby state 23A of the self refresh mode similarly.

When the read command or the write command is received in the standby state 23A of the self refresh mode, the semiconductor memory device 1 executes the corresponding read operation or the write operation (Read/Write) 23B, and returns to the standby state 23A after the operation is terminated. Besides, when the power down command (PD Entry) is received in the standby state 23A, the semiconductor memory device 1 is transferred to a power down mode (Power Down) 23C, and the power down release command (PD Exit) is received in the power down mode 23C, it is transferred to the standby state 23A of the self refresh mode.

Besides, the external refresh command (ExREF CMD) is received in the standby state 23A of the self refresh mode, the semiconductor memory device 1 executes a refresh operation (Refresh) 24C at the memory cell array 8, and thereafter, it is transferred to a standby state of the synchronous mode without the self refresh (hereinafter, called also as "external refresh mode") (Sync. Standby w/o Self-Refresh) 24A automatically. Here, the external refresh command (ExREF CMD) is the command signal CMD from external requesting the refresh operation at the semiconductor memory device 1 (memory cell array 8). Besides, the external refresh mode is the synchronous mode, and it is the operation mode executing the refresh operation at the memory cell array 8 based on the external refresh command (ExREF CMD) from external of the semiconductor memory device 1. In this external refresh mode, the refresh operation at the memory cell array 8 is executed only by the external refresh command, and the refresh operation requested by other than the external refresh command, for example, the self refresh operation is not executed.

When the read command or the write command is received in the standby state 24A of the external refresh mode, the semiconductor memory device 1 executes a corresponding read operation or the write operation (Read/Write) 24B, and returns to the standby state 24A after the operation is completed. Besides, when the external refresh command (ExREF CMD) is received in the standby state 24A, it executes the refresh operation 24C at the memory cell array 8, and returns to the standby state 24A.

When the power down command (PD Entry) is received in the standby state 24A of the external refresh mode, the semiconductor memory device 1 is transferred to the power down mode 23C which is the same as the case when the power down command is received in the self refresh mode. Namely, when the power down command is received in the standby state 24A of the external refresh mode, the semiconductor memory device 1 is transferred to the power down mode 23C with self refresh. Consequently, when the power down release command (PD Exit) is received after that, it is transferred to the standby state 23A of the self refresh mode.

Besides, when a self refresh enable command (SREFEN CMD) for executing the self refresh operation is received in the standby state 24A of the external refresh mode, the semiconductor memory device 1 is transferred to the standby state 23A of the self refresh mode.

Further, the semiconductor memory device 1 is initialized (configuration register is initialized) in the self refresh mode and the external refresh mode, and thereby, the semiconductor memory device 1 is transferred to the asynchronous mode (Reset to Async in the drawing). Namely, when the system is initialized in the synchronous mode, the semiconductor memory device 1 is transferred to the asynchronous mode regardless of with or without self refresh.

Here, the power down modes 21C and 23C in the semiconductor memory device 1 of the present embodiment are the operation modes for executing the self refresh to keep the data only for a capacity set at the configuration register 2, and there are two types of power down modes of a "Partial Refresh Power Down" and a "Deep Power Down". The "Partial Refresh Power Down" executes the refresh operation, for example, for the memory cells of a predetermined region of a quarter or a eighth part of every bit capacity within the memory cell array 8, and the "Deep Power Down" does not execute the refresh operation at all.

Figure 3A:
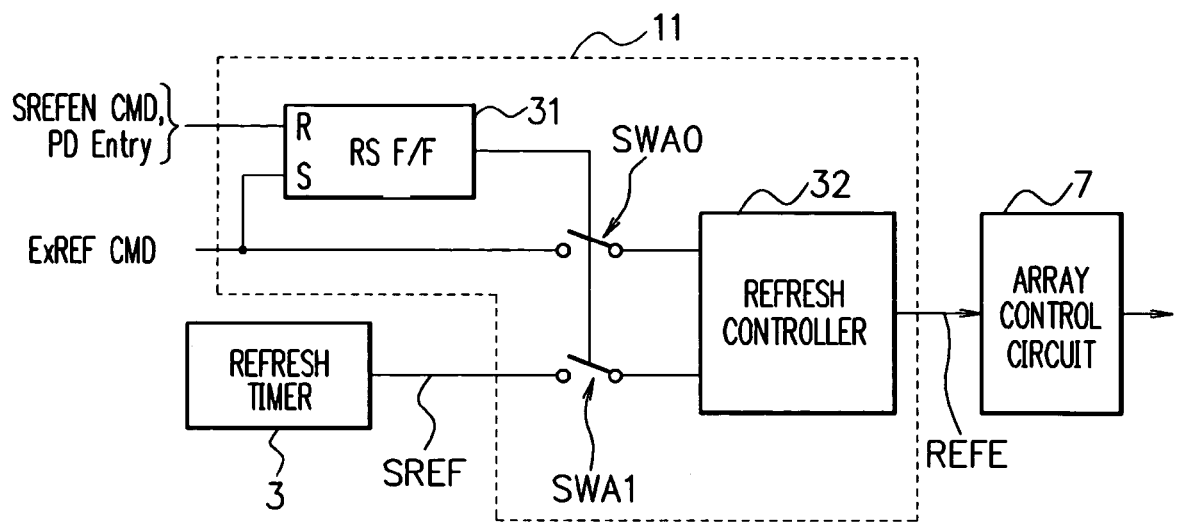
FIG. 3A and FIG. 3B are views showing configuration examples of a refresh control unit.

FIG. 3A is a block diagram showing a configuration of the refresh control unit 11 shown in FIG. 1.

The refresh control unit 11 has an RS flip-flop 31, a refresh controller 32, and switches SWA0 and SWA1.

The external refresh command ExREF CMD is inputted to a set input (S) of the RS flip-flop 31, and the self refresh enable command SREFEN CMD and the power down command PD Entry are inputted to a reset input (R) of the RS flip-flop 31. An output of the RS flip-flop 31 is supplied to the switches SWA0 and SWA1.

Besides, the external refresh command ExREF CMD is able to be inputted to the refresh controller 32 via the switch SWA0. The self refresh signal SREF from the refresh timer 3 is able to be inputted to the refresh controller 32 via the switch SWA1. An output of the refresh controller 32 is outputted to the array control circuit 7 as a refresh execution signal REFE for executing the refresh operation at the memory cell array 8.

The switches SWA0 and SWA1 are open and close controlled (on/off control) by the output of the RS flip-flop 31. The switches SWA0 and SWA1 are constituted so that either one of them is turned on in accordance with the output of the RS flip-flop 31, in other words, to be turned on exclusively. Here, the RS flip-flop 31 and the switches SWA0 and SWA1 constitute a refresh request selector in the present invention.

Figure 3B:
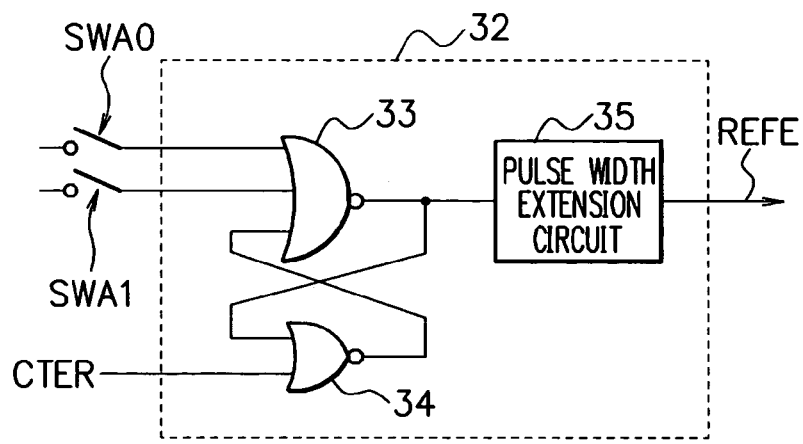

FIG. 3B is a view showing a configuration of the refresh controller 32. The refresh controller 32 has NOR (negative logical sum operation) circuits 33, 34, and a pulse width extension circuit 35.

The external refresh command ExREF CMD and the self refresh signal SREF are able to be inputted to the NOR circuit 33 via the switches SWA0 and SWA1. Besides, the output of the NOR circuit 34 is inputted to the NOR circuit 33. A memory core operation termination signal CTER showing that the operation for the memory cell array 8 is terminated, and the output of the NOR circuit 33 is inputted to the NOR circuit 34. Namely, the NOR circuits 33, 34 constitute an RS flip-flop, the external refresh command ExREF CMD and the self refresh signal SREF are inputted as the set inputs thereof, and the memory core operation termination signal CTER is inputted as the reset input.

Further, the output of the NOR circuit 33 (the RS flip-flop constituted by the NOR circuits 33, 34) is outputted as the refresh execution signal REFE via the pulse width extension circuit 35. Here, the pulse width extension circuit 35 is to prevent the input signal from passing through and outputted as it is when the input signal becomes in whisker state, and the pulse width of the input signal is enlarged to be outputted. Incidentally, it is not limited to the pulse width extension circuit 35, but it is suitable if the input signal in whisker state can be prevented to be outputted as it is, and a pulse filter may be used which removes the pulse in whisker state.

Here, the refresh operation in the semiconductor memory device 1 (memory cell array 8) is executed either by the external refresh command ExREF CMD inputted from external, or the self refresh signal SREF from the refresh timer 3 inside of the semiconductor memory device 1 to be the trigger. At the refresh control unit 11 shown in FIG. 3A and FIG. 3B, a selection of the external refresh command ExREF CMD and the self refresh signal SREF, namely, a switching of the command (signal) to be the trigger of the refresh operation is performed.

First, the RS flip-flop 31 is initialized so that the switch SWA0 is turned off, the switch SWA1 is turned on, and the self refresh signal SREF is to be the trigger of the refresh operation. This state is maintained until the external refresh command ExREF CMD is received. Consequently, the self refresh signal SREF is selected and inputted to the refresh controller 32 until the external refresh command ExREF CMD is inputted from external in the semiconductor memory device 1.

When the external refresh command ExREF CMD is inputted, the RS flip-flop 31 is set, and the switch SWA0 is turned on, the switch SWA1 is turned off by the output thereof. Herewith, the external refresh command ExREF CMD becomes valid as the trigger of the refresh operation and inputted to the refresh controller 32.

Subsequently, when the self refresh enable command SREFEN CMD is inputted, the RS flip-flop 31 is reset, and the switch SWA0 is turned off, the switch SWA1 is turned on by the output thereof. Herewith, the self refresh signal SREF becomes valid as the trigger of the refresh operation and inputted to the refresh controller 32. Incidentally, it is the same when the power down command PD Entry is inputted in stead of the self refresh enable command SREFEN.

As stated above, when the external refresh command ExREF CMD or the self refresh signal SREF is selected and inputted to the refresh controller 32, it is latched by the RS flip-flop constituted by the NOR circuits 33, 34. Accordingly, the refresh execution signal REFE is outputted from the RS flip-flop constituted by the NOR circuits 33, 34 via the pulse width extension circuit 35. Subsequently, when the refresh operation at the memory cell array 8 in accordance with the refresh execution signal REFE is terminated, the memory core operation termination signal CTER is inputted, and the RS flip-flop constituted by the NOR circuits 33, 34 is reset.

Here, when the operation mode of the semiconductor memory device 1 is transferred from the self refresh mode to the external refresh mode by the input of the external refresh command ExREF CMD in the self refresh mode, it is conceivable that the external refresh command ExREF CMD and the self refresh signal SREF may compete against each other. If the refresh operations in accordance with the respective command (signal) are executed, there are negative effects that the time required for the refresh becomes two times compared to the normal case, and the access request by the command signal CMD from external has to be waited during that period. Consequently, in the present embodiment, it is controlled so that a preceding command (signal) is valid and the duplicated command (the command subsequent to the preceding command) is ignored by the refresh control unit 11.

Concretely speaking, when the external refresh command ExREF CMD and the self refresh signal SREF compete against each other, the respective command (signal) are inputted to the set input of the RS flip-flop constituted by the NOR circuits 33, 34 within the refresh controller 32. After an enough period is lapsed to settle the state of the RS flip-flop constituted by the NOR circuits 33, 34 by the external refresh command ExREF CMD, the output of the RS flip-flop 31 for controlling the switches SWA0 and SWA1 is activated. The command latched by the RS flip-flop within the refresh controller 32 is reset after the corresponding core operation is terminated, but the self refresh signal SREF is not inputted to the refresh controller 32 because the switch SWA0 is turned on and SWA1 is turned off after the reset.

Incidentally, when the self refresh enable command SREFEN CMD or the power down command PD Entry is inputted, there is a case when the ON/OFF of the switches SWA0 and SWA1 may be switched while the self refresh signal SREF is active. However, in that case, there is no assurance that the pulse width to which the RS flip-flop constituted by the NOR circuits 33, 34 in the controller 32 can respond is to be secured, and the input signal in whisker state may be passed through this RS flip-flop. The pulse width extension circuit 35 is therefore provided to prevent inconveniences from occurring in the circuits connected subsequently.

As stated above, in the self refresh mode, the refresh operation is executed based on the self refresh signal SREF from the refresh timer 3 inside of the semiconductor memory device 1. Namely, a refresh timing is generated within the semiconductor memory device 1 and the refresh operation is executed. Consequently, the refresh timing is unknown from external of the semiconductor memory device 1, and therefore, when the command signal CMD from external is inputted and the access request of the read operation or the write operation is issued, the latency (access time) securing the time necessary for the execution of the refresh is required assuming that the refresh request is generated in advance. Consequently, the access time becomes a sum of the core operation time corresponding to the refresh and the time necessary for reading or writing of data from the time when the command signal CMD from external concerning the read operation or the write operation is inputted.

On the other hand, in the external refresh mode, the refresh operation is executed based on the external refresh command ExREF CMD inputted from external of the semiconductor memory device 1, and therefore, it is not necessary for the access time of the read operation or the write operation by the command signal CMD from external, to include the time necessary for the execution of the refresh. Consequently, the access time in the external refresh mode is only the time necessary for reading or writing of data requested by the command signal CMD from external, and the latency can be shortened for the core operation time corresponding to the refresh compared to the self refresh mode, and therefore, it is possible to realize the high-speed access operation in the semiconductor memory device 1.

Figure 4:
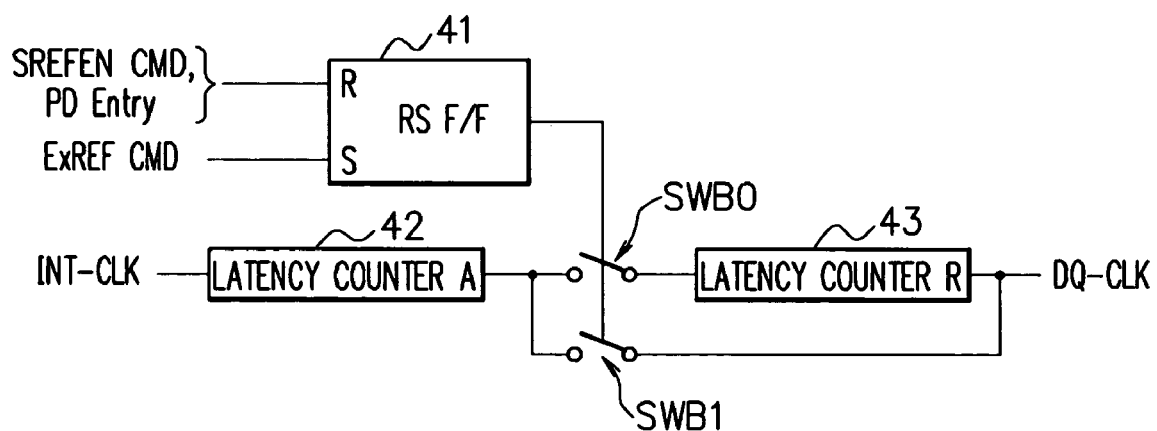
FIG. 4 is a view showing a configuration example of a latency counter.

This latency control in the synchronous mode (self refresh mode, external refresh mode) is achieved by using a latency counter shown in FIG. 4.

FIG. 4 is a block diagram showing a configuration of the latency counter, and it is provided, for example, in the access control unit 12 shown in FIG. 1. The latency counter has an RS flip-flop 41, a latency counter A 42, a latency counter R 43, and switches SWB0 and SWB1.

The external refresh command ExREF CMD is inputted to a set input (S) of the RS flip-flop 41, and the self refresh enable command SREFEN CMD and the power down command PD Entry are inputted to a reset input (R) of the RS flip-flop 41. An output of the RS flip-flip 41 is supplied to the switches SWB0 and SWB1.

The latency counter A 42 is a counter for counting a time necessary for the execution of the access operation by the command signal CMD from external, and a system clock signal INT-CLK used inside of the semiconductor memory device 1 is inputted. An output of the latency counter A 42 is able to be inputted to the latency counter R 43 via the switch SWB0, and it is also able to be outputted as a data clock DQ-CLK via the switch SWB1.

Besides, the latency counter R 43 is a counter for counting a time necessary for the execution of the refresh operation, and an output thereof is able to be outputted as the data clock DQ-CLK. Incidentally, the data clock DQ-CLK is a signal showing a time when the data signal DQ becomes valid during the read operation or the write operation.

The switches SWB0 and SWB1 are achieved an open/close control (on/off control) by the output of the RS flip-flop 41, and they are constituted so that either one of them are to be turned on in accordance with the output of the RS flip-flop 41, in other words, to be turned on exclusively.

In a initial state, the RS flip-flop 41 is initialized so that the switch SWB0 is turned on, and the switch SWB1 is turned off. This state is maintained until the external refresh command ExREF CMD is received, and at the latency counter shown in FIG. 4, the counts by the latency counter A 42 and the latency counter R 43 are performed. Consequently, the latencies required for the execution of the access operation and for the execution of the refresh operation are counted until the external refresh command ExREF CMD is inputted from external in the semiconductor memory device 1.

When the external refresh command ExREF CMD is inputted, the RS flip-flop 41 is set, and the switch SWB0 is turned off and the switch SWB1 is turned on by the output thereof. Herewith, the count by the latency counter R 43 counting the time necessary for the execution of the refresh operation becomes unnecessary, and the count only by the latency counter A 42 is performed at the latency counter shown in FIG. 4. Namely, the latency necessary for the execution of the access operation is counted.

Besides, when the self refresh enable command SREFEN CMD or the power down command PD Entry is inputted, the RS flip-flop 41 is reset, and the switch SWB0 is turned on and the switch SWB1 is turned off by the output thereof. Consequently, at the latency counter shown in FIG. 4, the counts by the latency counter A 42 and the latency counter R 43 are performed, and the latencies necessary for the execution of the access operation and for the execution of the refresh operation are counted.

As stated above, in the external refresh mode, the latency necessary for the execution of the access operation requested by the command signal CMD from external is counted, and in the operation mode other than the external refresh mode, the latency necessary for the execution of the refresh operation in addition to the latency necessary for the execution of the requested access operation are counted. Namely, in the operation mode other the external refresh mode (concretely speaking, the self refresh mode), a refresh sequence is included in an access pass and in the external refresh mode, the refresh sequence is not included in the access pass, and therefore, a higher-speed access operation can be realized in the external refresh mode than the other operation mode.

Figure 5:
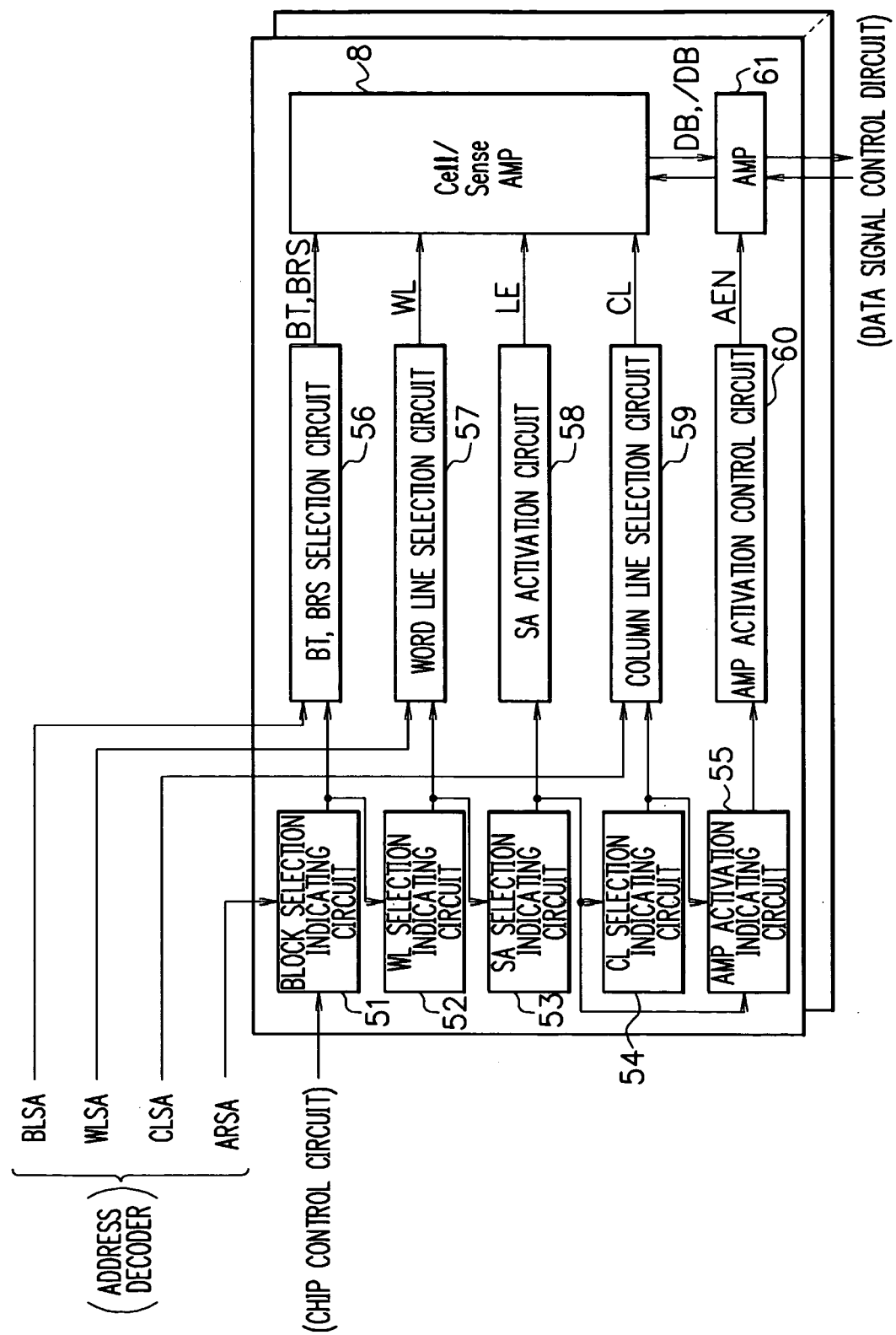
FIG. 5 is a view showing a configuration example of an array control circuit.

FIG. 5 is a block diagram showing a configuration example of the array control circuit 7 shown in FIG. 1, and the array control circuit 7 has respective circuits 51 to 61 except for the memory cell array 8 shown in FIG. 5.

In FIG. 5, a block selection indicating circuit 51, a word line (WL) selection indicating circuit 52, a sense amplifier (SA) selection indicating circuit 53, a column line (CL) selection indicating circuit 54, and an amplifier (AMP) activation indicating circuit 55 control operation timings of a block selection circuit 56, a word line selection circuit 57, a sense amplifier activation circuit 58, a column line selection circuit 59, and an amplifier activation control circuit 60, corresponding respectively.

The block selection circuit 56 selectively activates a bit line transfer signal BT in accordance with a block selection address signal BLSA supplied from the address decoder 5, and inactivates a precharge signal line BRS. The word line selection circuit 57 selectively activates the word line WL in accordance with a word line selection address signal WLSA supplied from the address decoder 5. The sense amplifier activation circuit 58 activates a sense amplifier drive signal line LE.

The column line selection circuit 59 selectively activates the column line CL in accordance with a column line selection address signal CLSA supplied from the address decoder 5. The amplifier activation control circuit 60 activates an amplifier drive signal line AEN for driving an amplifier 61. The amplifier 61 amplifies and outputs data read from the memory cell array 8 to the data signal control circuit 6.

Here, the operations in which the above-stated respective circuits 56 to 60 activate the signal lines (including selection operations) are executed sequentially based on indications from the respectively corresponding indicating circuits 51 to 55.

Concretely speaking, at first, the indication is issued from the block selection indicating circuit 51 to the block selection circuit 56, based on a control signal supplied from the chip control circuit 4 and an array selection address signal ARSA supplied from the address decoder 5. Subsequently, the indication is issued from the word line selection indicating circuit 52 to the word line selection circuit 57 under the condition that the indication is issued from the block selection indicating circuit 51.

Subsequently, the indications are sequentially issued similarly from the sense amplifier selection indicating circuit 53 to the sense amplifier activation circuit 58, from the column line selection indicating circuit 54 to the column line selection circuit 59, and from the amplifier activation indicating circuit 55 to the amplifier activation control circuit 60. However, the indication from the amplifier activation indicating circuit 55 to the amplifier activation control circuit 60 is issued under the condition that the indications both from the sense amplifier selection indicating circuit 53 and the column line selection indicating circuit 54 are issued.

Figure 6A:
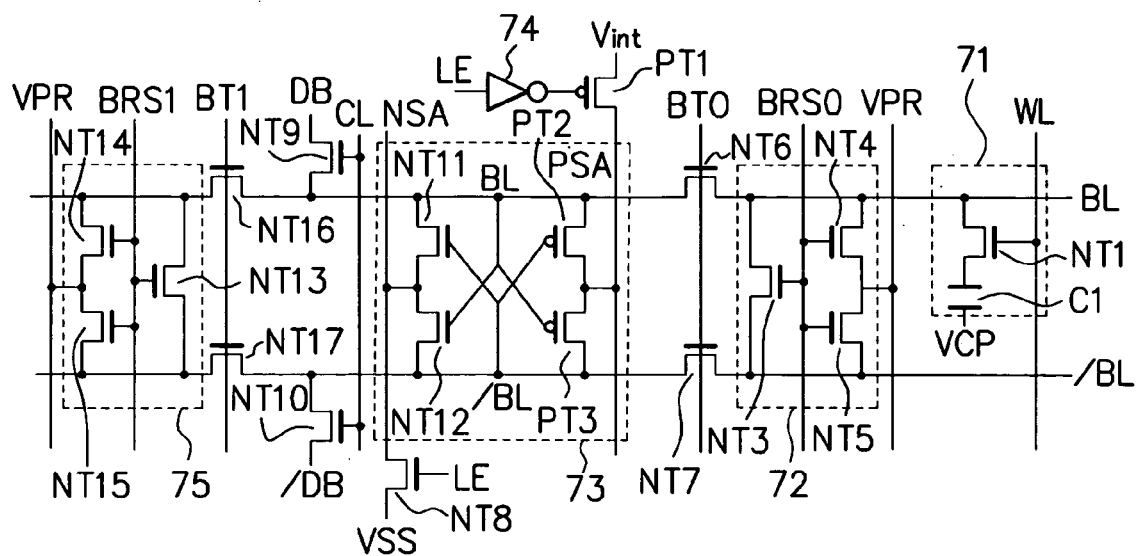
FIG. 6A is a view showing a configuration example of a memory cell in a memory cell array and peripheral circuits.
Figure 6B:
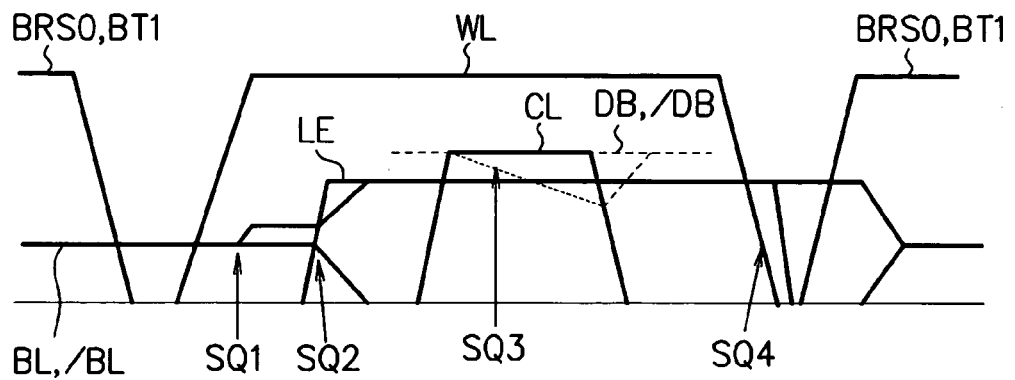
FIG. 6B is a view showing a data read sequence concerning the memory cell.

FIG. 6A is a circuit diagram showing the configuration of the memory cell array 8 shown in FIG. 1, and showing one memory cell and peripheral circuits thereof in the memory cell array 8 composed of the plural memory cells in the drawing. FIG. 6B is a timing chart explaining a data read operation in the circuits shown in FIG. 6A.

In FIG. 6A, C1 denotes a capacity, NT1 to NT17 denote N-channel type transistors, and PT1 to PT3 denote P-channel type transistors. The capacity C1 and the transistor NT1 constitutes a memory cell (1T1C-type memory cell). A group of the transistors NT3 to NT5 and a group of the transistors NT13 to NT15 respectively constitutes precharge circuits 72 and 75. The transistors NT11, NT12, PT2, and PT3 constitute a sense amplifier 73. A reference numeral 74 denotes an inverter.

Information of one bit is stored in the capacity C1 of the memory cell 71. An operation when the data stored in this memory cell 71 (capacity C1) is read, is described with reference to FIG. 6B.

Incidentally, when none of the data read operation, the data write operation, or the refresh operation is executed, bit line transfer signal lines BT0, BT1 and precharge signal lines BRS0, BRS1 are activated and they are in "H". Consequently, the transistors NT3 to NT5, NT13 to NT15 in the precharge circuits 72, 75, and the transistors NT6, NT7, NT16, and NT17 are conducted, and electric potentials of the bit lines BL and /BL become equal electric potentials.

When the data is read, first, the bit line transfer signal line except for the bit line transfer signal line BT0 corresponding to the memory cell 71 (the bit line transfer signal line BT1 in the circuit shown in FIG. 6A) and the precharge signal line BRS0 are inactivated to turn to "L". Consequently, the precharge circuit 72 becomes to be a non-operation state, and the transistors NT16, NT17 become to be non-conductive states (release of a reset state of the sense amplifier 73). The bit line transfer signal line BT0 maintains to be in "H".

Next, when the word line WL is selectively activated to turn to "H", the transistor NT1 is conducted, and the data stored in the capacity C1 is read to the bit line BL. Herewith, the electric potential of the bit line BL is changed (SQ1) in accordance with the data stored in the capacity C1. Here, the transistors NT6, NT7 are in conductive states, the transistors NT16, NT17 are in non-conductive states, and therefore, the data (electric potentials) of the bit lines BL, /BL are supplied to the sense amplifier 73 via the transistors NT6, NT7.

Next, when a sense amplifier drive signal line LE is activated to turn to "H", the transistors NT8, PT1 are conducted to perform a power supply, and the sense amplifier 73 operates, to thereby amplify the data of the bit lines BL, /BL (SQ2). Subsequently, when the column line CL is selectively activated to turn to "H", the transistors NT9, NT10 as column gates are conducted, and the amplified data of the bit lines BL, /BL are outputted to data buses DB, /DB (SQ3).

Subsequently, the column line CL is inactivated to turn to "L", a rewrite of the read data to the memory cell 71 (capacity C1) is performed (SQ4), and thereafter, the word line WL is inactivated to turn to "L". Further, the data read operation is terminated by activating all of the bit line transfer signal lines BT0, BT1, and the precharge signal lines BRS0, BRS1 after the sense amplifier 73 is turned to be in the non-operation state by inactivating the sense amplifier drive signal line LE to turn to "L".

Incidentally, the data write operation to the memory cell 71 is the same as a conventional way, and the explanation thereof will not be given.

FIG. 7A and FIG. 7B are timing charts showing operation examples of the semiconductor memory device 1 according to the present embodiment. In FIG. 7A and FIG. 7B, a case when a read operation is executed in accordance with a command signal CMD from external is shown as an example.

FIG. 7A is the timing chart showing the read operation in the self refresh mode.

The semiconductor memory device 1 executes a requested read operation when an access request of the read operation by the command signal CMD from external is received at the time T10. Here, the semiconductor memory device 1 executes the requested read operation after a refresh operation is completed when the refresh operation at the memory cell array 8 is requested or executed based on the self refresh signal SREF from the refresh timer 3 at the time when the access request by the command signal CMD is received.

Consequently, as shown in FIG. 7A, a latency time LTS of the read operation in the self refresh mode is composed of a refresh operation period for executing the refresh operation (four cycles in the shown example) and a period to execute the read operation in accordance with the command signal CMD from external (three cycles in the shown example). Consequently, data 1A, 2A, and 3A read by the read operation are outputted as data signals DQ from the semiconductor memory device 1 from the time T17 when the latency time LTS is lapsed from the time T10 when the access request by the command signal CMD is received.

FIG. 7B is the timing chart showing the read operation in the external refresh mode.

The semiconductor memory device 1 immediately executes a requested read operation when an access request of the read operation by the command signal CMD from external is received at the time T20. The refresh operation at the memory cell array 8 is executed based on the external refresh command from external in the external refresh mode. Consequently, it is not necessary to consider the refresh operation concerning the read operation by the command signal CMD, and a period to make the refresh operation executable is not necessary.

Consequently, a latency time LTE of the read operation in the external refresh mode is composed of only the period executing the read operation in accordance with the command signal CMD from external (three cycles in the shown example) as shown in FIG. 7B. Consequently, the data 1A, 2A, and 3A read by the read operation are outputted as the data signals DQ from the semiconductor memory device 1 from the time T23 when the latency time LTE is lapsed from the time T20 when the access request by the command signal CMD is received.

FIG. 8 is a view showing command examples of the semiconductor memory device 1 according to the present embodiment.

In FIG. 8, CLK denotes a system clock signal, CE2 denotes a second chip enable signal, /CE1 denotes a first chip enable signal, /RF denotes a refresh signal, /ADV denotes an address valid signal, /OE denotes an output enable signal, /WE denotes a write enable signal, /UB denotes an upper byte enable signal, and /LB denotes a lower byte enable signal. An input terminal for inputting the respective signals is provided at the semiconductor memory device 1. Incidentally, a sign "/" added to the symbol of the signal shows that the signal is a negative logic.

Here, the first chip enable signal /CE1 corresponds to the chip enable signal /CE in the conventionally known SRAM or pseudo SRAM, and the second chip enable signal CE2 is for controlling whether the power down mode is made valid or not, and called also as a signal "ZZ".

In the present embodiment, the external refresh command ExREF CMD and the self refresh enable command SREFEN CMD are newly provided. These commands are realized by newly adding an input terminal of the refresh signal /RF, and combining a polarity of the refresh signal /RF and the existing commands of such as read and write (legal command). Herewith, an equivalent command system with the existing command when the external refresh does not exist is maintained, and it becomes possible to use the existing decode circuit (decode logic), and so on. Consequently, it is possible to add the external refresh command ExREF CMD and the self refresh enable command SREFEN CMD, with a small change amount, namely with a little designing amount for the existing one.

Figure 9A:
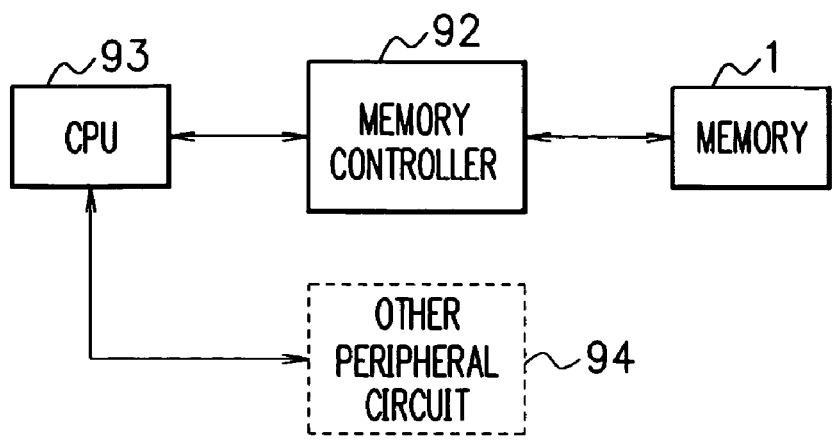
FIG. 9A and FIG. 9B are views for explaining an information processing system applying the semiconductor memory device according to the present embodiment.

FIG. 9A is a block diagram showing a configuration example of an information processing system 91 installing the semiconductor memory device 1 according to the present embodiment. The information processing system 91 constituted by having the semiconductor memory device (memory) 1 shown in FIG. 1, a memory controller 92, and a processor (CPU) 93.

The memory controller 92 controls the semiconductor memory device 1 based on a request from the processor (CPU) 93 and so on. For example, when the memory controller 92 receives an access request (read or write of data) for the semiconductor memory device 1 from the processor 93, it outputs the command signal CMD and the address signal ADD in accordance with the access request to the semiconductor memory device 1.

The processor 93 achieves an overall control of the information processing system 91, and issues the access request for the semiconductor memory device 1 to the memory controller 92. Besides, in the information processing system 91, other peripheral circuits 94 are provided in accordance with a use and so on of a cellular phone system and so on to which it is applied, and the processor 93 also achieves the control and so on of the peripheral circuits 94. In the peripheral circuits 94, there are, for example, a baseband processing circuit, a graphic processing circuit, and so on.

Figure 9B:
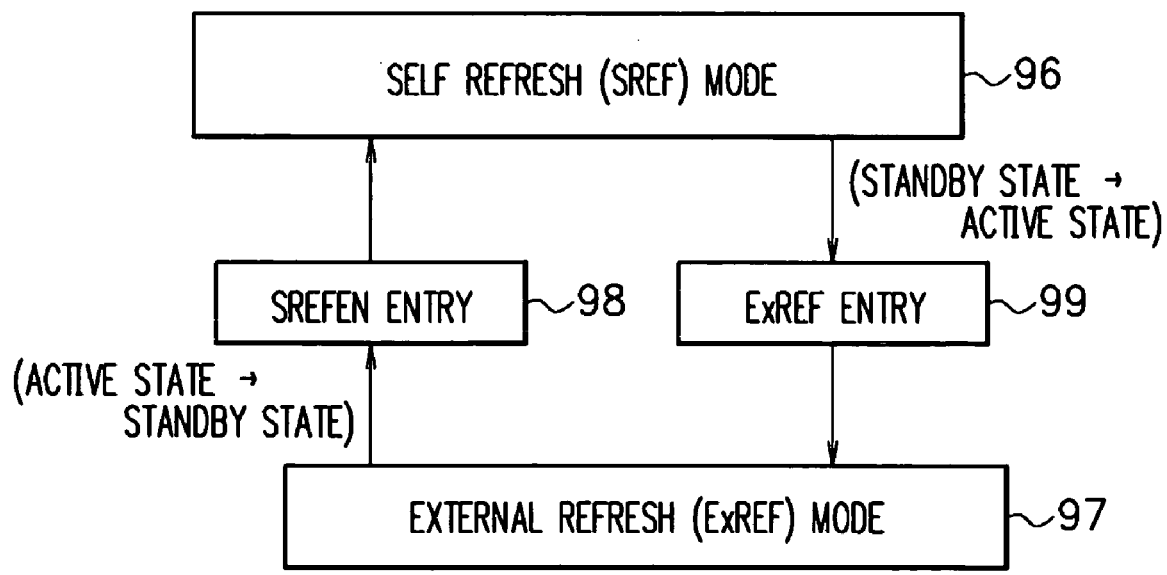

As shown in FIG. 9B, when an operation state at a system level thereof turns to a standby state from an active state in the information processing system 91 shown in FIG. 9A, the processor 93 entries the self refresh enable command SREFEN CMD to the semiconductor memory device 1 (98), and controls so that the operation mode of the semiconductor memory device 1 is to be the self refresh mode (96). Besides, when the operation state at the system level turns to the active state from the standby state, the processor 93 entries the external refresh command ExREF CMD to the semiconductor memory device 1 (99), and controls so that the operation mode of the semiconductor memory device 1 is to be the external refresh mode (97).

As stated above, the operation mode of the semiconductor memory device 1 is controlled in accordance with the operation state at the system level of the information processing system 91. The self refresh operation is executed when the operation state at the system level is in standby state, and the external refresh operation is executed when the operation state at the system level is in active state to thereby shorten the latency and realize the high-speed access operation.

Incidentally, when the power down command (PD Entry) is received in the external refresh mode 24A, in the description stated above, the semiconductor memory device 1 according to the present embodiment is transferred to the power down mode 23C with self refresh which is the same as the case when the power down command is received in the self refresh mode, and thereafter when the power down release command (PD Exit) is received, it is transferred to the self refresh mode 23A. Namely, when the power down release command (PD Exit) is received in the power down mode, the semiconductor memory device 1 according to the present embodiment is controlled to be transferred to the self refresh mode 23A regardless of the state before it is transferred to the power down mode.

Consequently, it is necessary to input the two commands of the power down release command (PD Exit) and the external refresh command (ExREF CMD) to control the semiconductor memory device 1 to transfer to the external refresh mode again after it is transferred from the external refresh mode to the power down mode.

Figure 10:
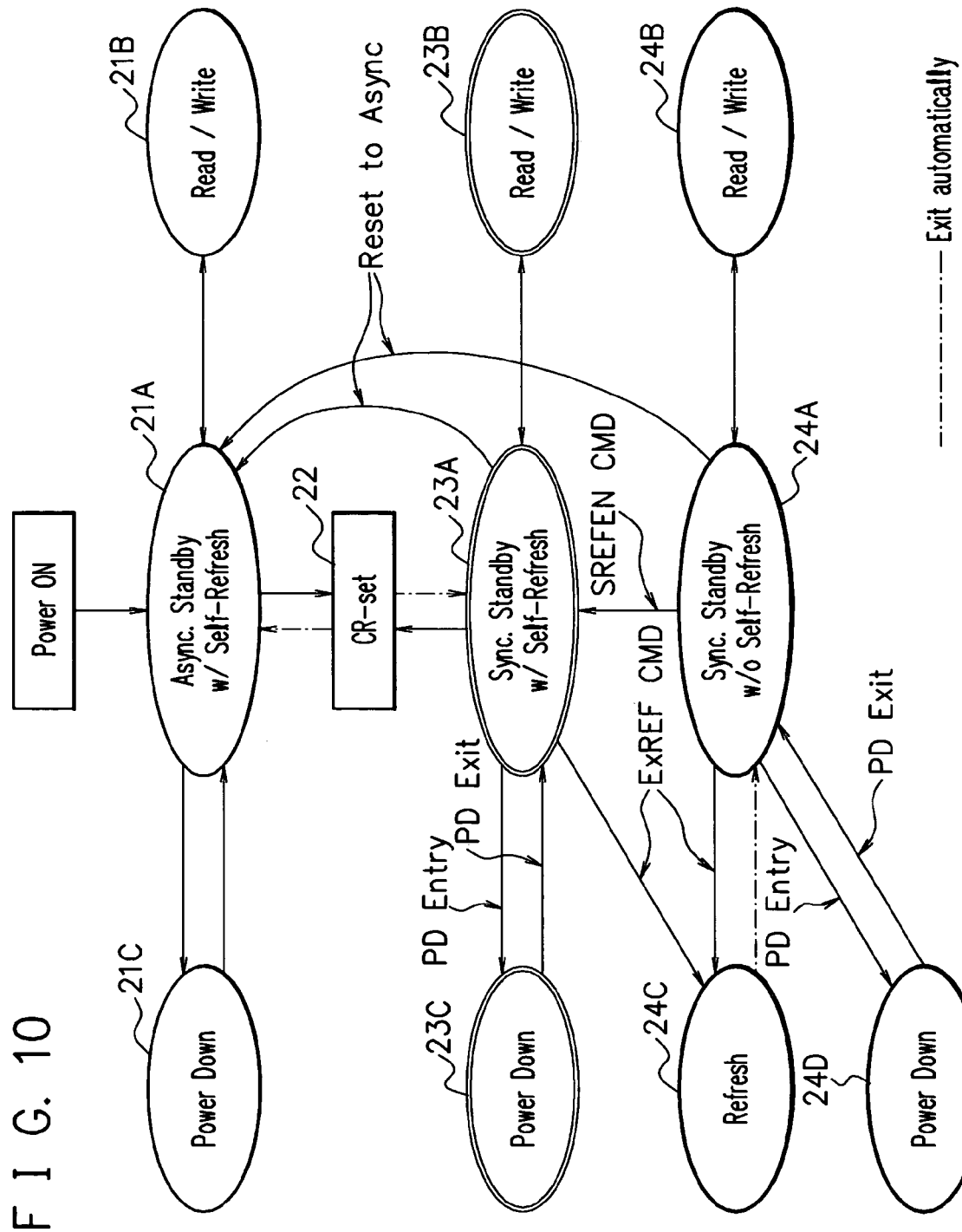
FIG. 10 is a view for explaining another example of the state control of the semiconductor memory device according to the present embodiment.
Figure 11:
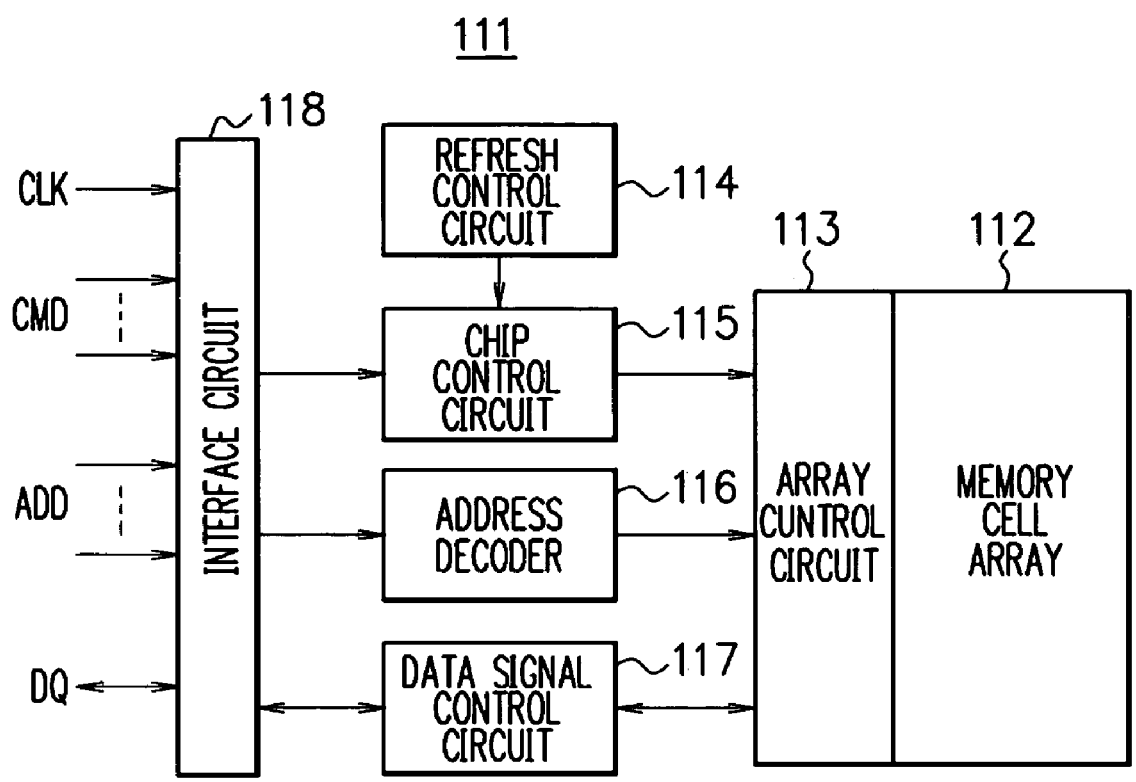
FIG. 11 is a block diagram showing a configuration of a conventional pseudo SRAM.
Figure 12A:
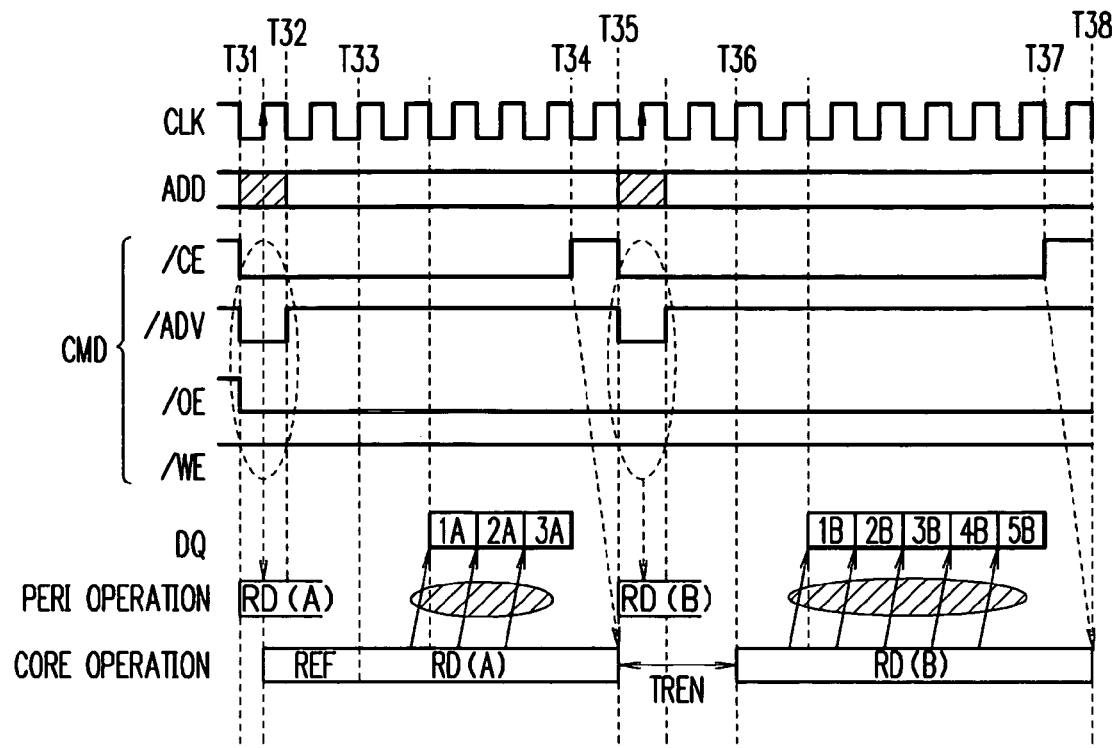
FIG. 12A and FIG. 12B are timing charts showing operations of the conventional pseudo SRAM.
Figure 12B:
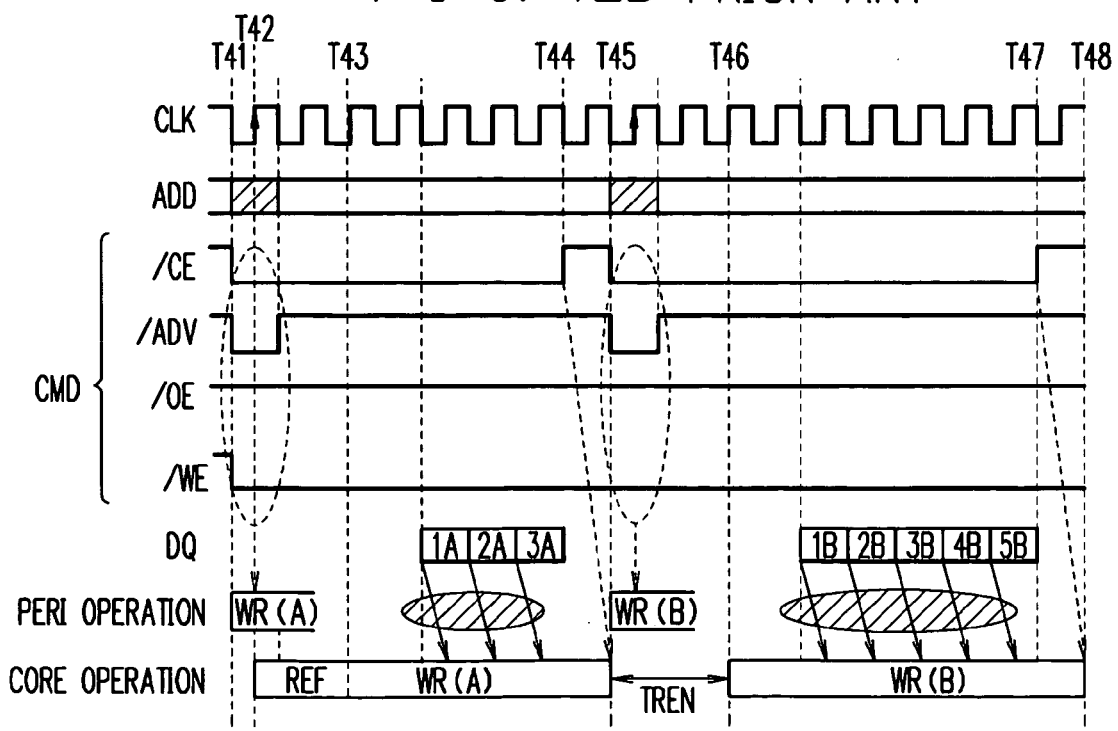

Consequently, as shown in FIG. 10, it can be configured that a power down mode 24D corresponding to the external refresh mode is further provided so that it becomes possible to be transferred to the external refresh mode 24A when the power down release command (PD Exit) is received in the power down mode 24D. Namely, it can be configured so that it is transferred to the operation mode before transferring to the power down mode, when the power down release command (PD Exit) is received in the power down mode.

FIG. 10 is a view for explaining another example of a state control of the semiconductor memory device 1 according to the present embodiment. In FIG. 10, the same reference numerals and symbols in FIG. 2 are used to designate the same and corresponding elements, and the duplicated description will not be given.

In the view shown in FIG. 10, a point that when the power down command (PD Entry) is received in the standby state 24A of the external refresh mode, it is transferred to the power down mode (Power Down) 24D, and when the power down release command (PD Exit) is received in the power down mode 24D, it is transferred to the standby state 24A of the external refresh mode, is different from the view shown in FIG. 2. Incidentally, in the power down mode 24D, the self refresh operation is executed inside of the semiconductor memory device 1.

As stated above, the power down mode 24D corresponding to the external refresh mode is provided, and thereby, it becomes possible to control the semiconductor memory device 1 to transfer to the external refresh mode again only by inputting one command of the power down release command (PD Exit) after it is transferred to the power down mode from the external refresh mode.

Incidentally, when the state control of the semiconductor memory device 1 is set as shown in FIG. 10, the power down command PD Entry is not inputted to the refresh control unit 11 shown in FIG. 3A and the reset input (R) of the respective RS flip-flops 31, 41 in the latency counter shown in FIG. 4, but only the self refresh enable command SREFEN CMD is inputted. Herewith, the outputs of the RS flip-flops 31, 41 are not reset by the power down command PD Entry, and it becomes possible to keep the state before the transition to the power down mode even if the power down command PD Entry is inputted.

Besides, a high-speed access is generally required in the synchronous mode, and therefore, in the description stated above, the switching between the self refresh mode and the external refresh mode, in other words, the switching to execute the refresh operation based on whether the self refresh signal SREF or the external refresh command ExREF CMD is made possible only in the synchronous mode, but it may be set so that the switching is also possible in the asynchronous mode.

Concretely speaking, the external refresh mode in which the refresh operation is executed based on the external refresh command ExREF CMD is newly provided also in the asynchronous mode, in addition to the self refresh mode in which the refresh operation is executed based on the self refresh signal SREF, and the state control is achieved as same as in the synchronous mode. In this case, it becomes possible to realize the high-speed access operation by shortening the access time also in the asynchronous mode.

Besides, the respective switches SWA0, SWA1, SWB0, and SWB1 in the refresh control unit 11 shown in FIG. 3A and the latency counter shown in FIG. 4 can be composed of, for example, transfer gates. Besides, the switches SWA0, SWA1, SWB0, and SWB1 realize selective operations, and the selective operations may be realized by using a selector or a logic circuit without limiting to the switches.

According to the present invention, it is possible to execute the access operation for the memory cell array in accordance with the access request from external only with a necessary time to execute the operation in accordance with the access request without including a necessary time to execute the refresh operation, when the refresh operation is to be executed based on the refresh request from external. Consequently, when the refresh operation is to be executed based on the refresh request from external, it is possible to shorten the latency concerning the access request for the memory cell array from external, for the necessary time to execute the refresh operation in comparison with the case when the refresh operation is executed based on the internal refresh request, and thereby, it is possible to realize the high-speed access operation of a semiconductor memory device.

Incidentally, the present embodiment stated above is to be considered in all respects as illustrative and no restrictive, and all changes which come within the meaning and range of equivalency of the claims are therefore intended to be embraced therein. The invention may be embodied in other specific forms without departing from the spirit of essential characteristics thereof.

What is claimed is:

1. A semiconductor memory device, comprising:
    a memory cell array in which a plurality of memory cells storing data are disposed;
    a refresh control unit capable of switching whether a refresh operation for keeping the data stored in the memory cell is executed based on an external refresh request inputted from external, or an internal refresh request generated internally, and indicating an execution of the refresh operation in accordance with the refresh request; and
    an array control unit executing the refresh operation at said memory cell array based on the indication from said refresh control unit; and
    wherein said refresh control unit has a refresh request selector selecting the external refresh request or the internal refresh request in accordance with an operation state of the semiconductor memory device, and
    wherein the refresh request selector selects the external refresh request during a period from an input of the external refresh request to an input of a self refresh permission request permitting a self refresh operation, and selects the internal refresh request other than the period.

2. The semiconductor memory device according to claim 1,
    wherein said refresh control unit indicates the execution of the refresh operation based on a former refresh request, and a later refresh request is to be ignored when the external refresh request and the internal refresh request compete.

3. The semiconductor memory device according to claim 1, further comprising:
    an internal refresh request unit having a timer function and generating and outputting the internal refresh request every time when a predetermined period is lapsed.

4. The semiconductor memory device according to claim 1, further comprising:
    a latency control unit controlling a latency concerning an access request from external for said memory cell array depending on whether the refresh operation is executed based on the external refresh request or the internal refresh request.

5. The semiconductor memory device according to claim 4,
    wherein said latency control unit has a first counter measuring a time required for processing the access request from external, and a second counter measuring a time required for processing the refresh operation, and switches whether the second counter is used in addition to the first counter or not in accordance with the refresh request by which the refresh operation is executed.

6. The semiconductor memory device according to claim 1,
    wherein a power-saving mode in which the refresh operation is executed only for the memory cells within a partial region of said memory cell array set in advance, is able to be set as an operation state.

7. The semiconductor memory device according to claim 6,
    wherein said refresh control unit indicates the execution of the refresh operation based on the internal refresh request regardless of the operation state before a transition to the power-saving mode, when the operation state is transferred from the power-saving mode to a normal operation mode.

8. The semiconductor memory device according to claim 6,
    wherein said refresh control unit indicates the execution of the refresh operation based on the refresh request which is the same as the refresh request selected in the operation state before the transition to the power-saving mode, when the operation state is transferred from the power-saving mode to the normal operation mode.

9. The semiconductor memory device according to claim 1,
    wherein the external refresh request is issued by combining a newly provided signal and an existing command signal.

10. The semiconductor memory device according to claim 1,
    wherein an asynchronous operation mode in which the access operation from external for said memory cell array is executed in asynchronous with an inputted clock signal, and a synchronous operation mode in which the access operation is executed in synchronous with the clock signal are able to be set and switched as the operation state, and
    wherein said refresh control unit is capable of switching whether the refresh operation is executed based on the external refresh request or the internal refresh request only in the synchronous operation mode.

11. The semiconductor memory device according to claim 10,
    wherein the operation state is arbitrary able to be switched from the synchronous operation mode to the asynchronous operation mode, and the refresh operation is executed based on the internal refresh request in the asynchronous operation mode.

12. The semiconductor memory device according to claim 10,
   wherein said refresh control unit is capable of switching whether the refresh operation is executed based on the external refresh request or the internal refresh request, further in the asynchronous operation mode.

13. An information processing system, comprising:
   a semiconductor memory device according to claim 6;
   a control device controlling and managing an operation state of said semiconductor memory device and capable of outputting an external refresh request to said semiconductor memory device.

14. The information processing system according to claim 13,
   wherein the operation state of said semiconductor memory device is controlled in accordance with the operation state of the information processing system.

15. A semiconductor memory device comprising:
   a memory cell array configured to include a plurality of memory cells to store data;
   a configuration register configured to store an operation mode of the semiconductor memory device;
   a command decoder unit configured to receive an external refresh request from external and output the external refresh request;
   a refresh timer unit configured to generate an internal refresh request;
   a refresh control unit configured to include a refresh selector that selects one of the external refresh request and the internal refresh request in accordance with the operation mode stored in the configuration register; and
   an array control unit configured to execute a refresh operation in accordance with the selected refresh request.

16. The semiconductor memory device according to claim 15, further comprising:
   a latency control unit controlling a latency concerning an access request from external for said memory cell array based on the external refresh request or the internal refresh request.

17. The semiconductor memory device according to claim 16,
   wherein said latency control unit has a first counter configured to measure a time required for processing the access request from external, and a second counter configured to measure a time required for processing the refresh operation.

18. The semiconductor memory device according to claim 17,
   wherein said latency control unit uses at least one of the first counter and the second counter based on the external refresh request or the internal refresh request.

19. The semiconductor memory device according to claim 16,
   wherein the operation mode, wherein the asynchronous operation mode and a synchronous operation mode, wherein the asynchronous operation mode is that the access operation from external for said memory cell array is executed in asynchronous with an inputted clock signal, and wherein the synchronous operation mode is that the access operation is executed in synchronous with the clock signal.

20. The semiconductor memory device according to claim 19,
   wherein said refresh control unit switches whether the refresh operation is executed based on the external refresh request or the internal refresh request only in the synchronous operation mode.

21. An information processing system comprising:
   a semiconductor memory device; and
   a control device configured to control an operation mode of said semiconductor memory device and output an external refresh request to said semiconductor memory device,
   wherein the semiconductor memory device comprises:
   a memory cell array that includes a plurality of memory cells to store data;
   a configuration register that stores the operation mode of the semiconductor memory device;
   a command decoder unit configured to receive the external refresh request and output the external refresh request;
   a refresh timer unit configured to generate an internal refresh request;
   a refresh control unit that include a refresh selector configured to select one of the external refresh request and the internal refresh request in accordance with the operation mode stored in the configuration register; and
   an array control unit configured to execute a refresh operation in accordance with the selected refresh request.

22. The information processing system according to claim 21,
   wherein the operation mode of said semiconductor memory device is controlled in accordance with an operation state of the information processing system.

* * * * *